(12) United States Patent
Quint et al.

(10) Patent No.: US 11,175,774 B2
(45) Date of Patent: Nov. 16, 2021

(54) METHOD FOR DETERMINING A TIME OF CONTACT ON A CAPACITIVE SENSOR ELEMENT

(71) Applicant: KOSTAL Automobil Elektrik GmbH & Co. KG, Luedenscheid (DE)

(72) Inventors: Stephan Quint, Schiffweiler (DE); Philipp Ciolek, Sprockhoevel (DE); Christoph Rebbe, Bochum (DE); Carl Christian Lexow, Dortmund (DE)

(73) Assignee: KOSTAL Automobil Elektrik GmbH & Co. KG, Luedenscheid (DE)

( * ) Notice: Subject to any disclaimer, the term of this patent is extended or adjusted under 35 U.S.C. 154(b) by 65 days.

(21) Appl. No.: 16/569,810

(22) Filed: Sep. 13, 2019

(65) Prior Publication Data

US 2020/0004380 A1 Jan. 2, 2020

Related U.S. Application Data

(63) Continuation of application No. PCT/EP2018/056091, filed on Mar. 12, 2018.

(30) Foreign Application Priority Data

Mar. 15, 2017 (DE) ...................... 10 2017 002 482.0

(51) Int. Cl.
*G06F 3/041* (2006.01)
*G06F 3/044* (2006.01)
(Continued)

(52) U.S. Cl.
CPC ............ *G06F 3/0418* (2013.01); *G06F 3/044* (2013.01); *H03K 17/962* (2013.01); *H03H 17/06* (2013.01)

(58) Field of Classification Search
CPC ..... G06F 3/0418; G06F 3/044; H03K 17/962; H03H 17/06
See application file for complete search history.

(56) References Cited

U.S. PATENT DOCUMENTS 6,145,491 A * 11/2000 Wilstermann .......... F02P 17/12
123/406.35
7,205,777 B2 4/2007 Schulz et al.
(Continued)

FOREIGN PATENT DOCUMENTS

DE 102010041464 A1 4/2011
EP 1505734 A2 2/2005
EP 3002574 A1 * 4/2016 ............. G01D 3/032

OTHER PUBLICATIONS

International Bureau, International Preliminary Report on Patentability for International Application No. PCT/EP2018/056091, dated Sep. 17, 2019.
(Continued)

*Primary Examiner* — Patrick N Edouard
*Assistant Examiner* — Eboni N Giles
(74) *Attorney, Agent, or Firm* — Brooks Kushman P.C.

(57) ABSTRACT

A method for determining a time of contact of a capacitive sensor includes continuously measuring a capacitance value of the capacitive sensor and processing the measured capacitance value into a digital sensor signal. The sensor signal is filtered to output a filter signal. Initial dynamics of the filter signal are identified upon the filter signal exceeding a first set filter threshold value. A time at which the filter signal falls below a second set filter threshold value is determined as being a potential time of contact of the capacitive sensor. An actual time of contact of the capacitive sensor is determined when the sensor signal relative to an offset of the sensor signal exceeds a sensor signal threshold value. The
(Continued)

offset of the sensor signal is a value of the sensor signal prior to the contact of the capacitive sensor.

12 Claims, 2 Drawing Sheets

(51) Int. Cl.
    *H03K 17/96*     (2006.01)
    *H03H 17/06*     (2006.01)

(56) References Cited

U.S. PATENT DOCUMENTS

| 10,126,340 | B2 | 11/2018 | Simmons |
| 2004/0257267 | A1 | 12/2004 | Mafune et al. |
| 2005/0068712 | A1 | 3/2005 | Schulz et al. |
| 2013/0147752 | A1* | 6/2013 | Simmons ............ G06F 3/0443 345/174 |
| 2015/0130478 | A1* | 5/2015 | Erkens ............ G01R 27/2605 324/601 |
| 2015/0130755 | A1* | 5/2015 | Jain ............ G06F 3/0445 345/174 |
| 2015/0293621 | A1* | 10/2015 | Singh ............ G06F 3/044 345/173 |
| 2016/0138941 | A1* | 5/2016 | Hirota ............ G07C 9/30 340/5.2 |
| 2016/0231856 | A1 | 8/2016 | Suwald et al. |
| 2019/0170891 | A1* | 6/2019 | Lazarescu ............ G01V 3/088 |

OTHER PUBLICATIONS

European Patent Office, International Search Report for International Application No. PCT/EP2018/056091, dated Aug. 1, 2018.
German Patent and Trademark Office, German Search Report for corresponding German Patent Application No. DE 10 2017 002 482.0, dated Aug. 13, 2019.

* cited by examiner

METHOD FOR DETERMINING A TIME OF CONTACT ON A CAPACITIVE SENSOR ELEMENT

CROSS-REFERENCE TO RELATED APPLICATIONS

This application is a continuation of International Application No. PCT/EP2018/056091, published in German, with an International filing date of Mar. 12, 2018, which claims priority to DE 10 2017 002 482.0, filed Mar. 15, 2017; the disclosures of which are hereby incorporated in their entirety by reference herein.

TECHNICAL FIELD

The present invention relates to a method for determining a time of contact on a capacitive sensor element, wherein a capacitance value of the sensor element is continuously measured and processed to form a digital sensor signal.

BACKGROUND

Methods of this type are used to evaluate capacitive contact (touch) sensors or proximity sensors. Such a sensor can detect the presence and with an appropriate design, the location, of a contact or approach by an object, for example, a finger of a user or a pin, within a sensitive area. The contact-sensitive area may, for example, overlap a display screen. In a display application, the contact sensor or proximity sensor may allow the user to directly interact with what is displayed on the screen, not just indirectly via a mouse or similar input device.

There are a number of different types of contact sensors, for example resistive contact sensors, contact sensors with acoustic surface waves, and capacitive contact sensors; the latter, with which in particular even a mere approach may be detected, in the meantime have become most widely used.

When an object touches or comes close to the surface of a capacitive contact sensor element, a change in the capacitance value of the sensor element occurs. The task of an associated sensor controller or measuring method used by the sensor controller is to process this change in capacitance to detect the triggering contact or approach of the object. The particular difficulty lies in the fact that the capacitance values of the sensor elements, and in particular the changes to be detected, are very small.

For this reason, these values are preferably measured using so-called integration methods, in which small charge quantities are transmitted in multiple successive cycles from a sensor element, whose capacitance value is relatively small and variable, to an integration capacitor having a known capacitance value that is fixed and much larger. The voltage at the integration capacitor after a preset number of such integration cycles is measured by means of an A/D converter or evaluated by a comparator circuit and processed into a digital sensor signal. However, the change in capacitance can be determined via other methods.

DE 10 2010 041 464 A1 describes a method for recognizing contact on a capacitive sensor element in which a digital sensor signal, as described above, is continuously detected and compared to a predefined signal threshold value. The sensor signal remains at an essentially constant base value as long as no finger or other object to be detected approaches the sensor element. In contrast, the sensor signal increases markedly when a finger approaches the sensor element. The actual recognition of a contact (i.e., touch) of the sensor element takes place when the sensor signal has exceeded a preset signal threshold value.

In fact, the sensor signal depends on many parameters. Thus, not only the shape and dimensions of the body part of the operator that is used, for example the effect that thinner or thicker fingers have on this sensor signal, but also, for example, the positioning of this body part above the sensor element play an important role. Thus, the greatest sensitivity is typically present directly above the center of gravity of the sensor element and decreases toward the edge of the sensor element. These influences may be compensated for only to a limited extent by the elasticity of the skin surface or the finger.

In typical arrangements of sensor surfaces, in particular in a motor vehicle and the described evaluation, reliably triggering the function associated with recognizing the contact cannot be ensured via a preset signal threshold value. Possible operation of the sensory function while wearing gloves further exacerbates the problem. For a design of the signal threshold value that allows operation with gloves, in an operation without gloves, an erroneous recognition of a presumed contact would take place even a few millimeters above the sensor surface.

Possibly desired active haptic feedback via an actuator system, such as a solenoid, a vibration motor, or the like similarly requires a contact of the surface. For this purpose, in the prior art, the capacitive sensor system must be supplemented with a force sensor system, which from a technical standpoint is much more complex and expensive.

SUMMARY

The method according to the present invention has the advantage over the techniques described above that not only is the general recognition of a contact of a capacitive sensor element made possible, but also the time of the contact may be determined with great accuracy and with high signal-to-noise gain. This ensures not only the recognition of a contact of the sensor element, practically independently of the described influencing parameters such as size, shape, and positioning of the finger or even gloves of varying thickness, but also virtually delay-free triggering of the action intended with the contact.

In accordance with embodiments of the present invention, a method for determining a time of contact of a capacitive sensor element is provided. A capacitance value of the sensor element is continuously measured and is processed into a digital sensor signal. The sensor signal is filtered by a digital filter, preferably a FIR filter, that carries out pulse compression with simultaneous offset elimination to generate a filter signal whose temporal pattern reflects or reproduces the dynamic behavior of the sensor signal. The observation of the filter signal allows not only a contact of the capacitive sensor element to be recognized in general, but also the exact time of this contact to be determined with a high degree of reliability.

More particularly, the continuously determined digital sensor signal runs through the following method steps. The sensor signal is filtered by the digital filter which generates the filter signal therefrom. The digital filter, preferably a FIR filter as indicated, generally shows high-pass or band-pass behavior. Initial or incipient dynamics of the filter signal are determined or identified upon the filter signal exceeding a first set filter threshold value. The time at which the filter signal falls below a second set filter threshold value is detected and this detected time is determined to be a potential time of contact of the sensor element. An actual time of contact of the sensor element is determined when the sensor signal with respect (i.e., relative) to its offset exceeds a sensor signal threshold value. The offset is the value of the sensor signal prior to the contact of the capacitive sensor element. The actual time of contact of the sensor element is outputted after being determined.

Firstly, optimal filtering of the sensor signal takes place by use of a digital filter, preferably a FIR filter, that carries out edge detection in the form of pulse compression with simultaneous offset elimination, and outputs the filter signal. This filter signal has minima and maxima as a function of the signal pattern and the superimposed noise, wherein the approach by the finger is expressed as an increasing filter signal until a maximum value of the filter signal is reached immediately before the time of contact. The amplitude value of such a maximum is much greater than that caused by noise, for example. According to the present invention, an increase in the filter signal is therefore assessed or rated as initial signal dynamics when the filter signal exceeds a first filter threshold value.

After the initial dynamics have been identified, a local, or better yet, a global, maximum of the filter signal is determined as maximum dynamics, and a second filter threshold value, preferably a temporary second filter threshold value, is set as a percentage of the value of the maximum of the filter signal, or a fixed, preset second threshold value is used.

The time at which the filter signal falls below the second temporary or fixed filter threshold value is output as the actual time of contact of the sensor element when the swing of the sensor signal resulting from the contact exceeds a predefined sensor signal threshold value. This sensor signal threshold value must be selected in such a way that on the one hand it takes the signal offset, i.e., the value of the sensor signal prior to the contact, into account as a virtual zero line. On the other hand, the sensor signal threshold value must be selected so that it additionally has sufficient distance from additive noise.

However, the signal offset is generally not constant, and depends significantly on external parameters such as temperature. Thus, a predefined, fixed sensor signal threshold value would be shifted relative to the signal offset as a virtual zero line if the drift of the signal offset were not considered. To avoid effects on the contact recognition, it is therefore very important to minimize or even eliminate the effects of a temporally nonconstant signal offset by continuously subtracting the signal offset from the sensor signal.

The filter signal has the property that its time integration results in an offset-free reconstruction of the pattern or swing of the sensor signal. Active drift compensation of a signal drift caused by temperature fluctuations, for example, by a control loop having a relatively large time constant, generates from the reconstructed sensor signal an error signal, which is also used for further signal evaluation. If the filter signal exceeds a first set filter threshold value, initial dynamics are identified, and the drift compensation of the reconstructed sensor signal is switched off.

The time at which the filter signal falls below the second temporary or fixed filter threshold value is output as the actual time of contact of the sensor element when the error signal of the drift compensation, as a measure of the drift- and offset-free, reconstructed sensor signal at that time, is above a set sensor signal minimum value that has a sufficient distance from noise.

After the output of a time of the contact of the sensor element, a new output of such a time of contact is blocked until the completion of the contact that has just been output is recognized. For this purpose, a second sensor signal threshold value is preferably set as a percentage of the maximum value of the drift- and offset-free, reconstructed sensor signal, and the completion of the contact is recognized when this reconstructed sensor signal falls below the second, set sensor signal threshold value. After the completion of the contact has been recognized, the entire system is enabled for a new recognition.

Due to the filtering of the sensor signal according to the present invention, preferably by means of a FIR filter, the temporal behavior of the sensor signal during an approach to, or contact of, the sensor element may be observed. As a result of the pulse compression that is carried out, the temporal pattern of the filter signal reflects the dynamic behavior of the sensor signal, and at the same time improves the signal-to-noise ratio, so that even weak amplitudes, for example due to glove actuation, may be reliably recognized.

When a finger or some other body part approaches the sensor element from a fairly large distance, the sensor signal steadily increases. When the sensor element is contacted, the finger is then decelerated and deformed in terms of its elasticity. This process is reflected in the temporal behavior of the sensor signal in such a way that the sensor signal initially increases much more slowly, and then remains essentially constant when the finger makes full contact. This behavior, in qualitative terms, is largely independent of the size of the finger, the positioning of the finger on the sensor surface, and whether or not gloves are used.

Regardless of the signal characteristic, actuations may take place very quickly or very slowly, so that a broad dynamic range must be covered. According to the present invention, this takes place via multiple signal evaluation paths whose dynamic ranges overlap, and which respond to contact at essentially different speeds and with different sensitivities. While the sampling rate of the original sensor signal is suitable for addressing the highest dynamics, this signal is utilized to supply the path that has the greatest bandwidth.

For this purpose, in one refinement of the method according to the present invention, the continuously determined, original sensor signal is down-sampled by averaging over multiple successive values. In this down-sampling procedure, the individual signal values are averaged using the same or differently selected weighting factors. Depending on the number of down-sampling steps, further signal branches result which in subsequent signal processing steps each address a different signal dynamic, in which, however, the sensor signals run through the same method steps explained in greater detail above.

The method according to the present invention makes use, among other things, of the knowledge that for controlling the quantitative differences that are present in the temporal pattern of the sensor signal, it is generally sufficient to carry out an evaluation method in parallel in only two method branches, each having different time scales. For this purpose, the continuously determined sensor signal is down-sampled by averaging over multiple, preferably four, successive values to form a second sensor signal.

The original, first sensor signal and the down-sampled second sensor signal in each case then run through the further method steps in method branches carried out in parallel. The aim of the further method steps is to determine the universal, qualitative pattern of the sensor signal. When the behavior that is characteristic of a contact of the sensor element is identified in one of the two branches, then the determined time of the contact is output.

Due to the group delay of linear systems, which increases with the effective number of memory cells (delay blocks), the particular path that evaluates the highest signal dynamics is always the first to respond, since it is shortest in terms of time, relative to the initial time basis. The response time of subsequent paths increases as a function of the effective time basis that results from the down-sampling. The path that undergoes the greatest segmentation or division with respect to the initial clock rate will be the last to trigger.

According to the present invention, use is made of this intrinsic delay so that in the event of a triggering, the path that triggers the highest signal dynamics, i.e., the fastest actuation, is preferred, in that as soon as an actuation has been recognized, all other paths for a triggering are blocked. Double or multiple triggers during a single actuation are thus avoided.

Resetting and re-enabling of the entire system, in particular the enabling of all controllers, takes place when the completion of the actuation is recognized. This may (but does not have to) happen when the channel having the lowest dynamics recognizes the completion of the actuation. This recognition is based on a renewed discrimination of the error signal of the controller step, which corresponds to the drift- and offset-free sensor signal. The necessary threshold value is computed from a percentage of the maximum amplitude of the error signal that occurs during the actuation. If the error signal falls below this threshold, then this means that the actuation has concluded, and the overall system is enabled for a new recognition.

BRIEF DESCRIPTION OF THE DRAWINGS

The method according to the present invention is explained below with reference to the flow charts provided in the appended drawings in which.

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
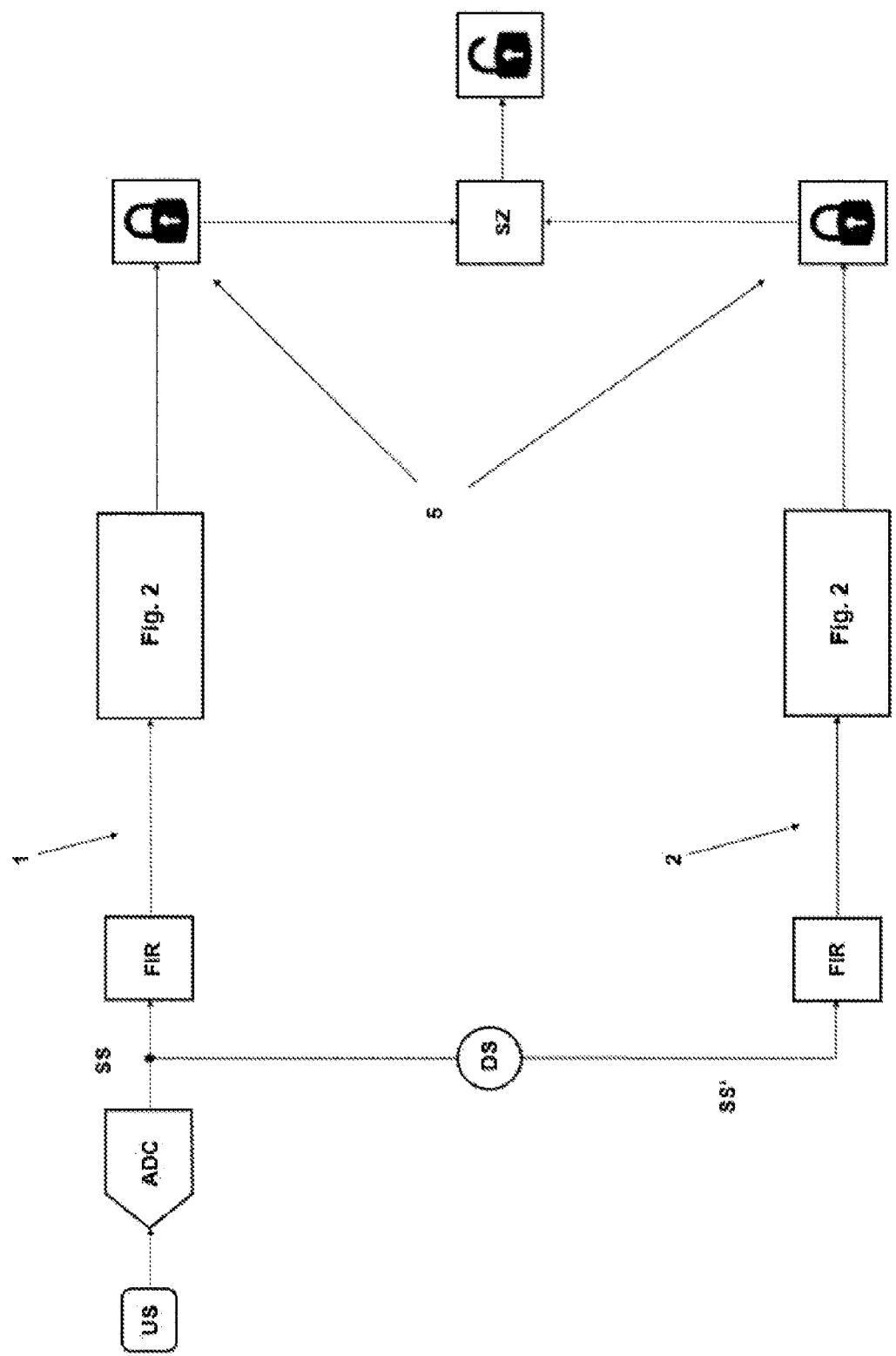
FIG. 1 illustrates the temporal pattern of the method according to the present invention, from the A/D conversion of the sensor signal to the start of the next measurement.

As shown in the drawing in FIG. 1, in the specific example the analog voltage values US, measured by means of the continuously applied integration process, are supplied at a rate of 500 samples per second (SPS) to an A/D converter ADC, where they are processed to form a digital sensor signal SS of the same rate. However, the signal may also be obtained in other ways, such as by weighing methods, general impedance measurement, frequency response, or others. In addition, the initial sample rate may be selected to be different from 500 SPS, provided that the overall required dynamic range is considered.

This digital sensor signal SS, as the first sensor signal SS, is sent directly to a first method branch 1. In parallel, this digital sensor signal SS is processed in a down-sampling unit DS by forming a rolling average over multiple successive values to form a second sensor signal SS', which is supplied to a second method branch 2.

The original, first sensor signal SS and the down-sampled, second sensor signal SS' then undergo pulse compression in each case by a FIR filter FIR in the first and second method branches 1 and 2 carried out in parallel. The values of the sensor signal SS, SS' are initially stored in a ring buffer (FIFO). Ideally, the memory size and the memory length exactly correspond to the temporal length of a signal edge to be recognized. With each new value of the sensor signal SS, SS', the oldest value is deleted from the ring buffer, so that a quasi-continuous assessment of the entire signal edge can take place.

All values of the sensor signal SS, SS' in the memory cells of the ring buffer are then multiplied by a set of weighting factors, and the results of the multiplication are summed. This method is also referred to as time discrete convolution or correlation, and the resulting output signal of the FIR filters from that point on is referred to as the filter signal FS, FS'. The weighting factors may be selected in such a way that a completely arrived signal edge results in a maximum filter signal FS, FS', whereas an incompletely arrived signal edge results in a filter signal FS, FS' that hardly differs from zero.

In selecting the weighting factors, the lowest common denominator between various edge profiles and edge lengths must be found. Various edge profiles share the common feature that each edge has an inflection point. Since the edge profiles before and after the inflection point may be different, in the specific example a set of weighting factors is selected that corresponds to +1 and −1, and optionally 0. The first half of the values of the sensor signal that arrive in the FIR filter is multiplied by −1, and the half of the values that subsequently arrive is multiplied by +1. However, the values may in fact differ from +/−1, and the polarity of the resulting signal may likewise be freely selected.

In the present exemplary embodiment, the value "12" has been selected as the length of the filter FIR, i.e., the number of memory cells in the ring buffer. This filter length in conjunction with the selected sampling rate of the sensor signal of 500 samples per second provides the best recognition performance for the conditions carried out in a test subject trial. The filter signal FS, FS' that is output in each case by this type of FIR filter in both method branches 1, 2 then corresponds essentially to a time discrete derivative of the smoothed input signal of the FIR filter. Since, although the filtering is accompanied by a bandwidth reduction, but no down-sampling is carried out at this location, the resulting signal is oversampled relative to the bandwidth, so that the temporal resolution of the sensor signal is maintained.

Figure 2:
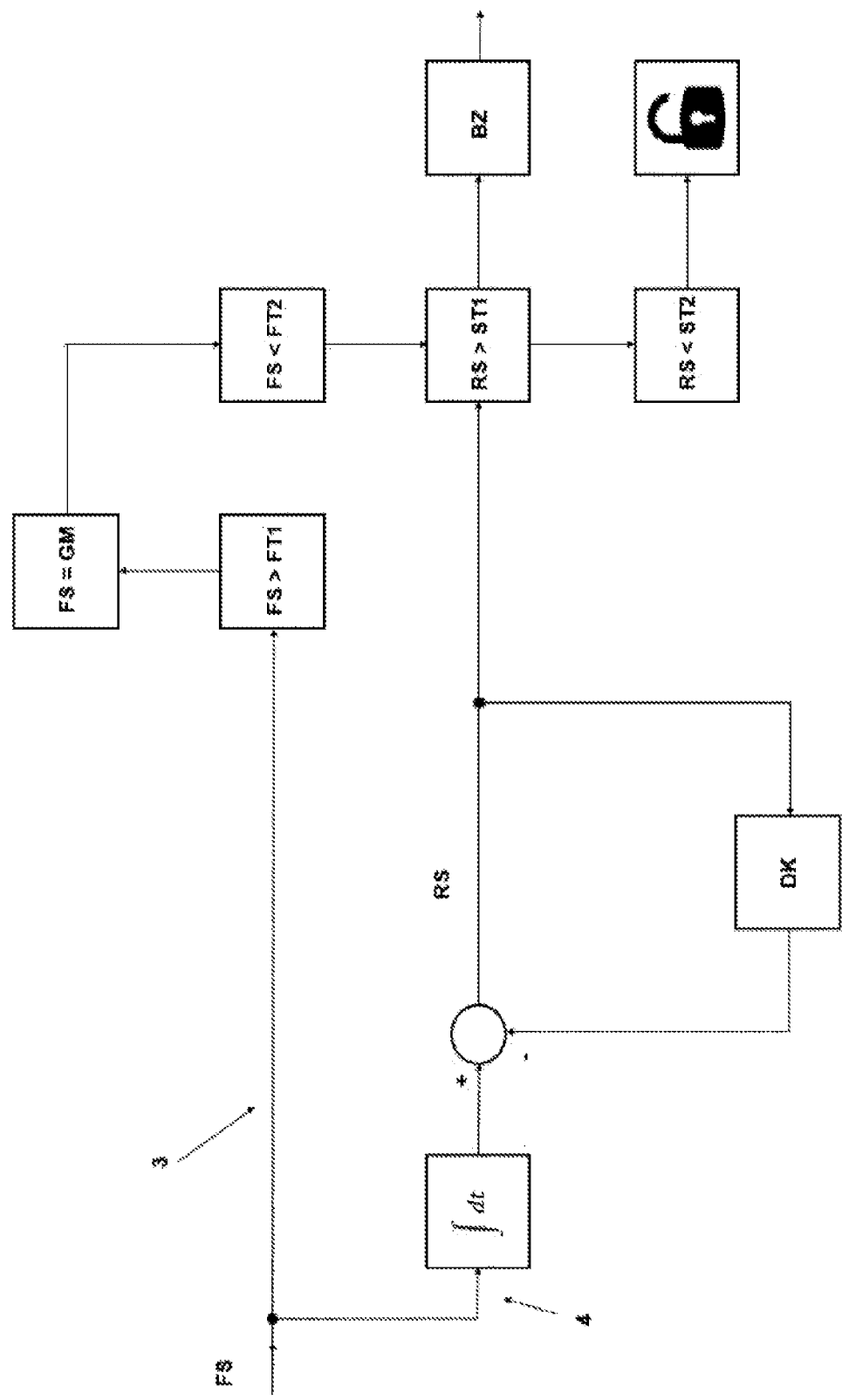
FIG. 2 illustrates a detailed view of the portion of the temporal pattern, common to both method branches, denoted by the "FIG. 2" blocks in FIG. 1.

The following method steps, which are identical in both method branches 1 and 2, are further described with reference to FIG. 2. The distinction between the sensor signals and filter signals SS, SS' and FS, FS', respectively, of the method branches 1 and 2 is omitted, and only the reference symbols SS and FS are used in the following discussion.

In each of the two method branches 1 and 2, in two branches that once again extend in parallel the filter signal FS is supplied on the one hand to a dynamic evaluation path 3 and on the other hand to a control path 4.

In the dynamic evaluation path 3, the filter signal FS is compared to a first set filter threshold value FT1. If the filter signal FS exceeds this first filter threshold value FT1, then initial dynamics are identified. It should be noted that first filter threshold value FT1 may correspond to zero, and therefore dynamics that lie within the noise may also be evaluated. Although this requires more computing power, the method is not affected thereby.

Upon identification of initial dynamics, sampling of the filter signal FS for the formation of a global maximum GM is initiated. As soon as the filter signal FS has formed such a global maximum GM, the value of this global maximum GM is used to define a second filter threshold value FT2. In the exemplary embodiment shown, the magnitude of this second filter threshold value FT2 is set at 25% of the value of the global maximum GM. The time of the contact may be directly influenced via the percentage value of the second threshold value FT2. If the value is defined as 50% of the maximum value, for example, then triggering takes place earlier. This effect may be utilized to compensate for the group delay of the signal by the system, so that the user perceives practically no delay in triggering. This is particularly suitable for the needs of many OEMs, who require very small latencies in the millisecond range (<50 ms). However, if this value is selected to be too high, then local maxima on the edge may already result in triggering. Therefore, a value of 25% (¼) has proven advantageous in terms of the latency requirements as well as the options for signal processing on low-power microcontrollers.

The filters FIR in the two method branches 1 and 2 are selected in such a way that the filter signal FS always assumes its maximum value when the signal edge has completely arrived, i.e., when the inflection point of the sensor signal is situated exactly in the center of the filter. Thus, if the maximum of the filter signal FS, i.e., the rising edge of the sensor signal SS, were exactly determined, then the time at which the sensor signal SS transitioned to a plateau would be known. However, in practical terms this is difficult to determine, since local maxima may be present on the dynamic signal due to the edge profile. Therefore, the global maximum GM of the filter signal FS is waited on, on the basis of which a dynamic threshold value FT2 below which the filter signal FS must fall before the contact recognition is triggered is determined.

Therefore, for determining the time of the contact of the sensor element, the time at which the filter signal FS falls below the second filter threshold value FT2 is initially determined.

Since the dynamic signal is very vulnerable to rapid changes in amplitude, which may be caused by jittering, for example, it is absolutely necessary to assess at the potential triggering time the swing of the original sensor signal SS relative to its signal offset, which is a criterion for the distance of the finger/body part from the sensor surface.

For this purpose, the original pattern of the sensor signal SS, i.e., of the input signal of the filter FIR, is reconstructed in the control path 4, extending in parallel, by continuous time integration of the filter signal FS. This reconstructed sensor signal RS is offset-free; i.e., its baseline is a zero line. However, a similar signal pattern may also be obtained by subtracting an appropriately adapted value, once or quasi-continuously, from the sensor signal. Before the reconstruction mechanism in the particular path is initially actively switched, it is necessary to wait for a certain time until the system, in particular the down-sampling steps DS and the pulse compression filter FIR, has reached a steady state in order to prevent the system offset from also being continuously reconstructed due to the integration of the filter response to the switching-on function (step function).

The signal swing of the sensor signal SS may thus be immediately read out as the level of the reconstructed sensor signal RS and compared to a further threshold value ST1. This sensor signal minimum value ST1 must be adapted based on the system but may be selected to be very small.

If the sensor signal minimum value ST1 is selected to be too small, then the sensor signal SS may already exceed this minimum value due to thermal drift. Therefore, it must be ensured that temperature drift of the reconstructed sensor signal RS does not affect the evaluation mechanism. For this purpose, the reconstructed sensor signal RS in a control loop DK for drift compensation, which in the present case comprises only an integrator, is consistently provided on the zero line with a relatively small gain factor. In the above-described identification of initial dynamics, this regulation mechanism DK is suspended to not rule out a possible contact recognition, in particular for very slow approaches. The control loop DK is once again enabled when the actuation is completed. The bandwidth of the control loop DK is much smaller than the bandwidth that results during touch actuations. Thus, neither of the two dynamics interferes.

If the drift- and offset-free, reconstructed sensor signal RS is above the set sensor signal minimum value ST1, then the time at which the filter signal FS falls below the second temporary filter threshold value FT2 is output as the time of the contact BZ of the sensor element.

To avoid multiple triggerings, the overall system is additionally provided with a so-called system lock mechanism 5. In the event of the valid output of a contact time BZ of the sensor element in one of the two method branches 1 and 2, this system lock mechanism 5 causes the detection on the respective other method branch to be discontinued for a blocking period SZ. Only when the blocking period SZ has elapsed, or a recognized actuation is completed, i.e., the finger is removed from the sensor element, is the overall system enabled for further recognitions.

For recognition of the completion of the contact that has just been output, a sensor signal threshold value ST2 is set as a fixed value or as a percentage of the maximum value of the drift- and offset-free, reconstructed sensor signal RS, and the completion of the contact is recognized when this reconstructed sensor signal RS falls below the set sensor signal threshold value ST2. After the completion of the contact has thus been recognized, the overall system is enabled for a new recognition.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A method for determining a time of contact of a capacitive sensor, the method comprising:
continuously measuring a capacitance value of the capacitive sensor and processing the continuously measured capacitance value into a digital sensor signal (SS);
filtering the sensor signal (SS) by a digital finite-impulse-response filter to output therefrom a filter signal (FS) that corresponds to a time discrete derivative of the sensor signal);
detecting initial dynamics of the filter signal (FS) upon the filter signal (FS) exceeding a first set filter threshold value (FT1);
determining a time, following the initial dynamics of the filter signal (FS) being detected, at which the filter signal (FS) falls below a second set filter threshold value (FT2) as being a potential time of contact of the capacitive sensor;

continuously integrating the filter signal (FS) to generate a reconstructed sensor signal (RS) that corresponds to a profile of the sensor signal (SS) that is devoid of a value that the sensor signal (SS) has prior to contact of the capacitive sensor;

determining the potential time of contact of the capacitive sensor as being an actual time of contact of the capacitive sensor in response to the reconstructed sensor signal (RS) exceeding a sensor signal threshold value (ST1) at the time at which the filter signal (FS) falls below the second set filter threshold value (FT2); and outputting the actual time of contact of the capacitive sensor.

2. The method of claim 1 wherein:
the filter has a high-pass or band-pass behavior.

3. The method of claim 1 further comprising:
down-sampling the sensor signal (SS) by averaging over multiple successive values to form a second sensor signal (SS'); and
wherein the sensor signal (SS) and the down-sampled sensor signal (SS') each run through same processing steps carried out in parallel.

4. The method of claim 1 wherein:
a drift compensation of the reconstructed sensor signal (RS) takes place via a regulation mechanism that initially waits for the transient effect of the filter, and the drift compensation is temporarily switched off when initial dynamics have been identified.

5. The method of claim 1 further comprising:
blocking detecting of another time of contact of the capacitive sensor until completion of the contact of the capacitive sensor; and
recognizing the completion of the contact of the capacitive sensor when the reconstructed sensor signal (RS) falls below a sensor signal threshold value (ST2) that is set as a function of a maximum value of the reconstructed sensor signal (RS).

6. The method of claim 5 wherein:
the sensor signal threshold value (ST2) is set to be around 25% of the maximum value of the reconstructed sensor signal (RS).

7. The method of claim 1 further comprising:
after the output of the actual time of contact of the capacitive sensor, preventing outputs of the actual time of contact from the processing branches for a blocking period.

8. The method of claim 7 further comprising:
terminating the blocking period until completion of the contact of the capacitive sensor is recognized.

9. The method of claim 1 wherein:
continuously measuring a capacitance value of the capacitive sensor and processing the measured capacitance value into a digital sensor signal (SS) includes measuring the capacitance value of the capacitive sensor by a continuously applied integration process in which a voltage present at an integration capacitor having a known capacitance value is measured in each case by an A/D converter and processed to form the digital sensor signal (SS).

10. The method of claim 1 wherein:
the first set filter threshold value (FT1) is set to zero.

11. The method of claim 1 further comprising:
in an event of a contact of the capacitive sensor, either dynamically computing the second set filter threshold value (FT2) as a percentage value of a maximum of the filter signal or selecting the second set filter threshold value (FT2) to be constant.

12. The method of claim 1 wherein:
the filtering of the sensor signal by the filter takes place by storing values of the sensor signal in memory cells of a ring buffer and then multiplying them by a set of weighting factors and summing the results of the multiplication.

\* \* \* \* \*